(12) United States Patent
Liu et al.

(10) Patent No.: US 11,997,891 B2
(45) Date of Patent: May 28, 2024

(54) DISPLAY SUBSTRATE, FABRICATING METHOD THEREOF AND DISPLAY PANEL

(71) Applicant: BOE TECHNOLOGY GROUP CO., LTD., Beijing (CN)

(72) Inventors: Li Liu, Beijing (CN); Pengcheng Lu, Beijing (CN); Rongrong Shi, Beijing (CN); Yuanlan Tian, Beijing (CN); Xiao Bai, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 726 days.

(21) Appl. No.: 17/259,465

(22) PCT Filed: Mar. 24, 2020

(86) PCT No.: PCT/CN2020/080869
§ 371 (c)(1),
(2) Date: Jan. 11, 2021

(87) PCT Pub. No.: WO2021/189247
PCT Pub. Date: Sep. 30, 2021

(65) Prior Publication Data
US 2022/0140050 A1    May 5, 2022

(51) Int. Cl.
*H10K 59/131* (2023.01)
*H10K 59/12* (2023.01)
*H10K 71/00* (2023.01)

(52) U.S. Cl.
CPC .......... *H10K 59/131* (2023.02); *H10K 71/00* (2023.02); *H10K 59/1201* (2023.02)

(58) Field of Classification Search
CPC .............. H10K 59/131; H10K 59/124; H10K 59/80518; H10K 59/80516; H10K 59/8722; H10K 59/1201
See application file for complete search history.

(56) References Cited

U.S. PATENT DOCUMENTS 6,617,645 B2 *  9/2003  Hirakata ............... H01L 27/124
                                                    257/E27.111
9,893,128 B2 *  2/2018  Choi ..................... H10K 59/38
(Continued)

FOREIGN PATENT DOCUMENTS

CN       101246844 A     8/2008
CN       101286472 A    10/2008
(Continued)

OTHER PUBLICATIONS

Office Action dated Jul. 28, 2022 issued in corresponding Chinese Application No. 202080000347.X.

*Primary Examiner* — Mary A Wilczewski
*Assistant Examiner* — Nathan A Pridemore
(74) *Attorney, Agent, or Firm* — Nath, Goldberg & Meyer; Joshua B. Goldberg

(57) ABSTRACT

Provided is display substrate, including driving circuit board, and first electrode layer, insulating layer, second electrode layer, isolation layer, transparent conductive layer sequentially stacked thereon. Driving circuit board includes pixel and bonding regions. First electrode layer includes first sub-portion in bonding region and second sub-portion in pixel region. Insulating and isolation layers are partially cover bonding and pixel regions. Insulating layer has first via hole in area corresponding to first sub-portion. Isolation layer has second via hole in the area. Axes of first and second via holes coincide, first sub-portion is exposed at first and second via holes. Second electrode layer is in pixel region, coupled to second sub-portion through third via hole in area corresponding to second sub-portion. Isolation layer has fourth via hole in area corresponding to second electrode layer. Transparent conductive layer is in pixel region, coupled to second electrode layer through fourth via hole.

18 Claims, 3 Drawing Sheets

(56) References Cited

U.S. PATENT DOCUMENTS

| | | | |
|---|---|---|---|
| 2006/0043510 A1* | 3/2006 | Yamazaki | H01L 27/1214 257/E27.111 |
| 2011/0199564 A1* | 8/2011 | Moriwaki | H10K 59/122 313/523 |
| 2012/0074388 A1 | 3/2012 | Park et al. | |
| 2015/0295092 A1* | 10/2015 | Misaki | H01L 27/124 257/43 |
| 2016/0233248 A1 | 8/2016 | Kwak et al. | |

FOREIGN PATENT DOCUMENTS

| | | |
|---|---|---|
| CN | 103928469 A | 7/2014 |
| CN | 104576659 A | 4/2015 |
| CN | 107230692 A | 10/2017 |
| CN | 107808895 A | 3/2018 |
| CN | 108172597 A | 6/2018 |
| CN | 109634467 A | 4/2019 |
| CN | 110112202 A | 8/2019 |
| CN | 110459699 A | 11/2019 |
| CN | 110504290 A | 11/2019 |

\* cited by examiner

DISPLAY SUBSTRATE, FABRICATING METHOD THEREOF AND DISPLAY PANEL

This is a National Phase Application filed under 35 U.S.C. 371 as a national stage of PCT/CN2020/080869, filed Mar. 24, 2020, the content of which is hereby incorporated by reference in its entirety.

TECHNICAL FIELD

The embodiments of the present disclosure belong to the field of display technology, and particularly relate to a display substrate, a method for fabricating the display substrate, and a display panel.

BACKGROUND

As novel display panels, Organic Light-Emitting Diode (OLED) display panels have been widely used in apparatuses, such as smart watches, mobile phones, tablet computers, and computer displays.

SUMMARY

Embodiments of the present disclosure provide a display substrate, a method for fabricating the display substrate, and a display panel.

In a first aspect, an embodiment of the present disclosure provides a display substrate, including a driving circuit board, and a first electrode layer, an insulating layer, a second electrode layer, an isolation layer, and a transparent conductive layer, which are sequentially stacked on the driving circuit board, where the driving circuit board includes a pixel region and a bonding region. The first electrode layer includes a first sub-portion in the bonding region and a second sub-portion in the pixel region; the first sub-portion is configured to be bound to and coupled with a peripheral circuit board, and the second sub-portion is coupled with a pixel circuit in the driving circuit board. The insulating layer and the isolation layer are both configured to partially cover the bonding region and partially cover the pixel region; the insulating layer is provided with a first via hole in an area corresponding to the first sub-portion, the isolation layer is provided with a second via hole in an area corresponding to the first sub-portion, axes of the first via hole and the second via hole coincide, and the first sub-portion is exposed at the first via hole and the second via hole. The second electrode layer is in the pixel region, and the second electrode layer is coupled to the second sub-portion through a third via hole provided in an area of the insulating layer corresponding to the second sub-portion. The isolation layer is provided with a fourth via hole in an area corresponding to the second electrode layer. The transparent conductive layer is in the pixel region, and the transparent conductive layer is coupled to the second electrode layer through the fourth via hole.

In some embodiments, in the bonding region, the isolation layer is configured to cover a sidewall of the first via hole.

In some embodiments, in the bonding region, the isolation layer is configured to further extend to cover a part of the insulating layer surrounding the first via hole.

In some embodiments, in the bonding region, the isolation layer is configured to further extend to cover the insulating layer in addition to covering the first via hole.

In some embodiments, an orthographic projection of the transparent conductive layer on the driving circuit board coincides with an orthographic projection of the second electrode layer on the driving circuit board.

In some embodiments, an orthographic projection of the second electrode layer on the driving circuit board at least partially overlaps an orthographic projection of the second sub-portion on the driving circuit board.

In some embodiments, a surface of the second electrode layer away from the driving circuit board is flush with a surface of the insulating layer away from the driving circuit board.

In some embodiments, the first electrode layer includes a first metal layer, and a material of the first metal layer includes aluminum.

In some embodiments, the first electrode layer further includes a first protective layer on a side of the first metal layer away from the insulating layer.

In some embodiments, the first electrode layer further includes a second protective layer on a side of the first metal layer close to the insulating layer.

In some embodiments, the first protective layer includes at least one of a first sub-protective layer and a second sub-protective layer; the second protective layer includes at least one of a first sub-protective layer and a second sub-protective layer; the first sub-protective layer and the second sub-protective layer of each of the first protective layer and the second protective layer are sequentially stacked in a direction away from the first metal layer; and a material of the first sub-protective layer of each of the first protective layer and the second protective layer includes titanium, and a material of the second sub-protective layer of each of the first protective layer and the second protective layer includes titanium nitride.

In some embodiments, the second electrode layer includes a second metal layer, and a material of the second metal layer includes aluminum.

In some embodiments, the second electrode layer further includes a third protective layer on a side of the second metal layer close to the insulating layer.

In some embodiments, the third protective layer includes at least one of a first sub-protective layer and a second sub-protective layer; the first sub-protective layer and the second sub-protective layer are sequentially stacked in a direction away from the second metal layer; and a material of the first sub-protective layer includes titanium, and a material of the second sub-protective layer includes titanium nitride.

In some embodiments, the isolation layer is made of an inorganic insulating material.

In some embodiments, the isolation layer has a thickness from 200 Å to 2000 Å.

In some embodiments, the transparent conductive layer is made of a semiconductor metal oxide material.

In some embodiments, the transparent conductive layer has a thickness from 200 Å to 2000 Å.

In a second aspect, an embodiment of the present disclosure provides a display panel, including any one of the above display substrates, and further including a light-emitting functional layer, a cathode, and an encapsulation layer, which are disposed in the pixel region of the display substrate, where the light-emitting functional layer, the cathode, and the encapsulation layer are sequentially stacked on the transparent conductive layer.

In a third aspect, an embodiment of the present disclosure provides a method for fabricating a display substrate, including: fabricating a driving circuit board; sequentially fabricating, on the driving circuit board, a first electrode layer, an insulating layer with a first via hole and a third via hole, a second electrode layer, an isolation layer with a fourth via hole, and a transparent conducting layer; and forming a second via hole in the isolation layer. The driving circuit board includes a pixel region and a bonding region. Fabricating the first electrode layer includes fabricating a first sub-portion in the bonding region and a second sub-portion in the pixel region, the first sub-portion being configured to be bound to and coupled with a peripheral circuit board, and the second sub-portion being coupled to a pixel circuit in the driving circuit board. Fabricating the insulating layer includes forming the insulating layer in both the bonding region and the pixel region, the first via hole being provided in an area of the insulating layer corresponding to the first sub-portion and the third via hole being provided in an area of the insulating layer corresponding to the second sub-portion. Fabricating the second electrode layer includes forming the second electrode layer in the pixel region, the second electrode layer being formed to be coupled to the second sub-portion through the third via hole. Fabricating the isolation layer includes forming the isolation layer in both the bonding region and the pixel region, the fourth via hole being provided in an area of the isolation layer corresponding to the second electrode layer, the second via hole being provided in an area of the isolation layer corresponding to the first sub-portion, where axes of the first and second via holes coincide, and the first sub-portion is exposed at the first and second via holes. Fabricating the transparent conductive layer includes forming the transparent conductive layer in the pixel region, the transparent conductive layer being formed to be coupled to the second electrode layer through the fourth via hole.

BRIEF DESCRIPTION OF THE DRAWINGS

The accompanying drawings are included to provide a further understanding of the embodiments of the present disclosure, constitute a part of this specification, and serve to explain the principles of the present disclosure together with the embodiments of the present disclosure and not to limit the present disclosure. The above and other features and advantages will become more apparent to those skilled in the art by describing detailed exemplary embodiments with reference to the drawings, in which.

Figure 1:
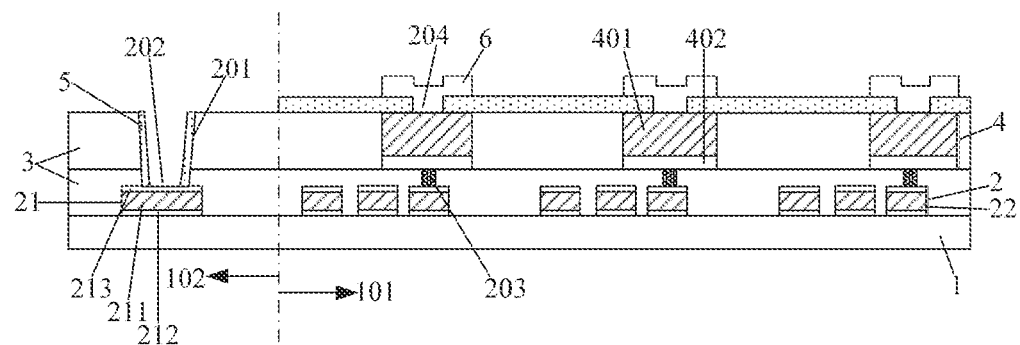
FIG. 1 is a structural cross-sectional view of a display substrate in an embodiment of the present disclosure.

REFERENCE NUMERALS 1. a driving circuit board; 2. a first electrode layer; 21. a first sub-portion; 22, a second sub-portion: 3. an insulating layer; 4. a second electrode layer; 5. an isolation layer; 6. a transparent conductive layer; 101. a pixel region; 102. a bonding region; 201. a first via hole; 202. a second via hole; 203. a third via hole; 204. a fourth via hole; 211. a first metal layer; 212. a first protective layer; 213. a second protective layer; 401. a second metal layer; 402. a third protective layer; 10. a base substrate; 11, a pixel circuit; 111. an active layer; 112. a gate insulating layer; 113. a gate electrode; 114. a first interlayer insulating layer; 115. a source electrode; 116. a drain electrode; 7. a light-emitting functional layer; 8. a cathode; and 9. an encapsulation layer.

DETAILED DESCRIPTION

In order to make those skilled in the art better understand the technical solutions of the embodiments of the present disclosure, a display substrate, a method for fabricating a display substrate, and a display panel provided in the embodiments of the present disclosure will be described in further detail with reference to the accompanying drawings and the specific embodiments.

Hereinafter, the embodiments of the present disclosure will be more fully described with reference to the accompanying drawings, but the illustrated embodiments may be embodied in different forms and should not be construed as being limited to the embodiments set forth herein. On the contrary, the purpose of providing these embodiments is to make the present disclosure thorough and complete, and to enable those skilled in the art to fully understand the scope of the present disclosure.

The embodiments of the present disclosure are not limited to the embodiments shown in the drawings, but include modifications of configurations formed based on fabricating processes. Thus, the regions illustrated in the drawings have schematic properties, and the shapes of the regions shown in the drawings illustrate specific shapes of the regions, but are not intended to be limiting.

In the existing technology, the problem of corrosion of terminals (mainly aluminum terminals) in bonding region occurs in the silicon-based OLED display panel. After the tape-out of the OLED backplane wafer in a wafer factory is finished, the terminals used for bonding in the bonding region need to be exposed so as to be convenient for performing probe Test (CP Test). When Indium Tin Oxide (ITO) anode patterns are fabricated in subsequent processes in a panel factory, the ITO in the bonding region is directly deposited on the terminals. During etching of the ITO, the terminal is corroded by chlorine in the etching process due to the fact that etching gas mainly includes chlorine, and therefore the quality of the OLED display panel is affected.

In view of the problem that the terminal in the bonding region of the silicon-based OLED display panel is corroded during etching for the ITO anode, the exemplary embodiments of the present disclosure provide a display substrate, a method for fabricating a display substrate, and a display panel.

Figure 2:
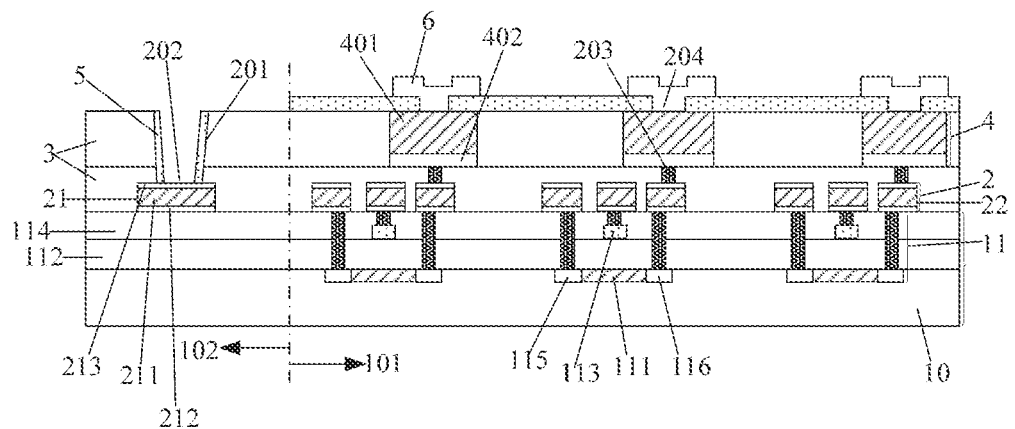
FIG. 2 is another structural cross-sectional view of a display substrate in an embodiment of the present disclosure.

An embodiment of the present disclosure provides a display substrate, as shown in FIGS. 1 and 2, including a driving circuit board 1, and a first electrode layer 2, an insulating layer 3, a second electrode layer 4, an isolation layer 5, and a transparent conductive layer 6, which are sequentially stacked on the driving circuit board 1. The driving circuit board 1 includes a pixel region 101 and a bonding region 102; and the first electrode layer 2 includes a first sub-portion 21 in the bonding region 102 and a second sub-portion 22 in the pixel region 101. The first sub-portion 21 is configured to be bound to and coupled with a peripheral circuit board, and the second sub-portion 22 is coupled with the pixel circuit in the driving circuit board 1. The insulating layer 3 and the isolation layer 5 both partially cover the bonding region 102 and partially cover the pixel region 101. The insulating layer 3 is provided with a first via hole 201 in an area corresponding to the first sub-portion 21, the isolation layer 5 is provided with a second via hole 202 in an area corresponding to the first sub-portion 21, the axes of the first via hole 201 and the second via hole 202 coincide, and the first sub-portion 21 is exposed at the first via hole 201 and the second via hole 202. The second electrode layer 4 is in the pixel region 101, and the second electrode layer 4 is coupled to the second sub-portion 22 through a third via hole 203 provided in an area of the insulating layer 3 corresponding to the second sub-portion 22. The isolation layer 5 is provided with a fourth via hole 204 in an area corresponding to the second electrode layer 4. The transparent conductive layer 6 is in the pixel region 101, and the transparent conductive layer 6 is coupled to the second electrode layer 4 through the fourth via hole 204.

The display substrate is a silicon-based OLED display substrate. The second sub-portion 22 of the first electrode layer 2 is configured for introduction and output of signals for the pixel circuit, and the second sub-portion 22 is generally provided in plural because of the introduction and output of plural signals involved in the pixel circuit. The first sub-portion 21 of the first electrode layer 2 is configured for bonding and connection with a peripheral circuit board, and the first sub-portion 21 is usually provided in plural. The first and second sub-portions 21 and 22 are prepared in one process and are therefore usually located in the same layer. The transparent conductive layer 6 serves as the anodes of the OLED light-emitting elements in the silicon-based OLED display substrate. The second electrode layer 4 serves as a reflective layer, and the second electrode layer 4 can reflect light irradiated thereon by the OLED light-emitting elements toward the side where the anodes are located, thereby implementing a top emission type silicon-based OLED display substrate. Since the pixel region 101 includes a plurality of sub-pixel regions, and each sub-pixel region is correspondingly provided with one OLED light-emitting element, each sub-pixel region is correspondingly provided with one anode, that is, the transparent conductive layer 6 also includes a plurality of sub-portions, and each sub-pixel region is correspondingly provided with one sub-portion of the transparent conductive layer 6, so as to realize the arrangement and display of the plurality of OLED light-emitting elements in the pixel region 101. Accordingly, the second electrode layer 4 also includes a plurality of sub-portions, and the sub-portions are in one-to-one correspondence with the anodes of the OLED light-emitting elements.

Before the formation of the transparent conductive layer 6, the isolation layer 5 covers the whole bonding region 102; and after the formation of the transparent conductive layer 6, a portion of the isolation layer 5 corresponding to the first via hole 201 is removed, that is, the second via hole 202 is formed in the isolation layer 5, so that the first sub-portion 21 is exposed at the first via hole 201 and the second via hole 202 whose axes coincide. By providing the isolation layer 5 between the second electrode layer 4 and the transparent conductive layer 6 and enabling the isolation layer 5 to cover the whole bonding region 102 before the transparent conductive layer 6 is formed, the first sub-portion 21 in the bonding region 102 can be isolated from the transparent conductive layer 6, so that the first sub-portion 21 is prevented from being corroded by etching when the pattern of the transparent conductive layer 6 is formed by etching, and the problem that the first sub-portion 21 is corroded when the pattern of the transparent conductive layer 6 is formed by etching is further effectively solved. The portion of the isolation layer 5 corresponding to the first via hole 201 is removed after the transparent conductive layer 6 is formed, namely, the second via hole 202 is formed in the isolation layer 5, such that the first sub-portion 21 is exposed at the first via hole 201 and the second via hole 202 whose axes coincide, so as to facilitate the bonding of first sub-portion 21 and the peripheral circuit board. The fabricating process of the isolation layer 5 is simple, which does not increase the complexity of the fabricating process of the display substrate.

In some embodiments, in the bonding region 102, the isolation layer 5 covers a sidewall of the first via hole 201.

In some embodiments, an orthographic projection of the transparent conductive layer 6 on the driving circuit board 1 coincides with an orthographic projection of the second electrode layer 4 on the driving circuit board 1. As such, on one hand, since the transparent conductive layer 6 serves as an anode of the OLED light-emitting element in the silicon-based OLED display substrate, and the second electrode layer 4 serves as a reflective layer, the second electrode layer 4 can reflect light irradiated thereon from the OLED light-emitting element to the side where the anode is located, thereby implementing a top-emission type silicon-based OLED display substrate; on the other hand, a driving signal for the OLED light-emitting element in the pixel circuit can be introduced into the transparent conductive layer 6 to drive the light-emitting functional layer of the OLED light-emitting element to emit light.

In some embodiments, the transparent conductive layer 6 is made of a semiconductor metal oxide material, such as ITO (indium tin oxide). The thickness of the transparent conductive layer 6 is from 200 Å to 2000 Å (angstrom).

In some embodiments, an orthographic projection of the second electrode layer 4 on the driving circuit board 1 at least partially overlaps an orthographic projection of the second sub-portion 22 on the driving circuit board 1. The second sub-portion 22 is configured to introduce a driving signal for an OLED light-emitting element in the pixel circuit into the second electrode layer 4. As such, it facilitates the second electrode layer 4 to be coupled to the second sub-portion 22 through the third via hole 203 in an area of the insulating layer 3 corresponding to the second sub-portion 22.

In some embodiments, a surface of the second electrode layer 4 away from the driving circuit board 1 is flush with a surface of the insulating layer 3 away from the driving circuit board 1. As such, it can ensure that the surface of the isolation layer 5 that is provided on the insulating layer 3 and second electrode layer 4 is flat, so as to ensure that the transparent conductive layer 6 serving as the anodes can be formed on the flat surface of the isolation layer 5, thereby ensuring good vapor evaporation effect of the light-emitting functional layer in the OLED light-emitting element in subsequent process.

In some embodiments, the isolation layer 5 is made of an inorganic insulating material, such as silicon oxide, silicon oxynitride, silicon nitride, or the like. The inorganic insulating material has better effects of preventing moisture and oxygen from penetrating therethrough, thereby providing better protection for preventing moisture and oxygen from invading the light-emitting element. In some embodiments, the isolation layer 5 may be made of an organic insulating material.

In some embodiments, the thickness of the isolation layer 5 is from 200 Å to 2000 Å. The isolation layer 5 having the thickness can form a good isolation and protection for the first sub-portion 21 when the pattern of the transparent conductive layer 6 is formed by etching, thereby preventing the first sub-portion 21 from being corroded by etching.

In some embodiments, the insulating layer 3 is made of an inorganic insulating material, such as silicon oxide, silicon oxynitride, silicon nitride, or the like. The inorganic insulating material has better effects of preventing moisture and oxygen from penetrating therethrough, thereby providing better protection for preventing moisture and oxygen from invading the light-emitting element. In some embodiments, the insulating layer 3 may be made of an organic insulating material.

In some embodiments, the first electrode layer 2 includes a first metal layer 211, and the material of the first metal layer 211 includes aluminum. The aluminum is light in weight and good in conductivity, and the conductivity of the first electrode layer 2 can be greatly improved.

In some embodiments, the first electrode layer 2 further includes a first protective layer 212 on a side of the first metal layer 211 away from the insulating layer 3. In an embodiment, the first electrode layer 2 further includes a second protective layer 213 on a side of the first metal layer 211 close to the insulating layer 3.

In some embodiments, the first protective layer 212 includes a first sub-protective layer and/or a second sub-protective layer; the second protective layer 213 includes a first sub-protective layer and/or a second sub-protective layer; the first sub-protective layer and the second sub-protective layer are sequentially stacked in a direction away from the first metal layer 211; the material of the first sub-protective layer includes titanium, and the material of the second sub-protective layer includes titanium nitride.

By providing the first protective layer 212 on the side of the first metal layer 211 away from the insulating layer 3, moisture and oxygen can be prevented from entering the first metal layer 211 from the side of the first metal layer 211 away from the insulating layer 3, so that the first metal layer 211 is prevented from being oxidized. By providing the second protective layer 213 on the side of the first metal layer 211 close to the insulating layer 3, moisture and oxygen can be prevented from entering the first metal layer 211 from the side of the first metal layer 211 close to the insulating layer 3, thereby preventing the first metal layer 211 from being oxidized.

In some embodiments, the second electrode layer 4 includes a second metal layer 401, and the material of the second metal layer 401 includes aluminum. Since aluminum has a very high reflectivity to light, the material of the second metal layer 401 including aluminum can improve display brightness without changing current.

In some embodiments, the second electrode layer 4 further includes a third protective layer 402 on a side of the second metal layer 401 close to the insulating layer 3.

In some embodiments, the third protective layer 402 includes a first sub-protective layer and/or a second sub-protective layer; the first sub-protective layer and the second sub-protective layer are sequentially stacked in a direction away from the second metal layer 401; the material of the first sub-protective layer includes titanium, and the material of the second sub-protective layer includes titanium nitride.

By providing the third protective layer 402 on the side of the second metal layer 401 close to the insulating layer 3, moisture and oxygen can be prevented from entering the second metal layer 401 from the side of the second metal layer 401 close to the insulating layer 3, so that the second metal layer 401 is prevented from being oxidized.

In an embodiment, a fourth protective layer may also be provided on a side of the second metal layer away from the insulating layer, where the fourth protective layer includes a first sub-protective layer and/or a second sub-protective layer; the first sub-protective layer and the second sub-protective layer are sequentially stacked in a direction away from the second metal layer; the material of the first sub-protective layer includes titanium, and the material of the second sub-protective layer includes titanium nitride. The fourth protective layer can prevent moisture and oxygen from entering the second metal layer from the side of the second metal layer away from the insulating layer, so that the second metal layer is prevented from being oxidized.

In some embodiments, the first via hole 201, the second via hole 202, the third via hole 203, and the fourth via hole 204 are filled with tungsten, which has no influence on the contact resistance of aluminum, and can achieve good conductive connection between electrodes at both ends of the via hole. In an embodiment, the orthographic projection of the via hole on the driving circuit board 1 may be a circle, and the diameter of the circle is greater than 0 nm and less than or equal to 500 nm. The size and shape of the via hole are not limited as long as the via hole can sufficiently electrically couple the electrodes at both ends thereof.

In some embodiments, as shown in FIG. 2, the driving circuit board 1 includes a base substrate 10 and a pixel circuit 11 disposed between the base substrate 10 and the first electrode layer 2. The pixel circuit 11 is configured to drive the light-emitting element to emit light. The pixel circuit 11 at least includes a switching transistor, a driving transistor, and a storage capacitor.

Here, taking the pixel circuit of 2T1C as an example, the pixel circuit at least includes one switching transistor, one driving transistor, and one storage capacitor. The source electrode of the switching transistor is coupled to the data signal terminal, and the drain electrode of the switching transistor is coupled to the gate electrode 113 of the driving transistor and one end of the storage capacitor. The source electrode 115 of the driving transistor is coupled to a VDD signal line or a signal terminal, the drain electrode 116 of the driving transistor is coupled to the other end of the storage capacitor and the second sub-portion 22 of the first electrode layer 2, the second sub-portion 22 of the first electrode layer 2 is coupled to the second electrode layer 4, and the second electrode layer 4 is coupled to the transparent conductive layer 6 that is on the side of the isolation layer 5 away from the second electrode layer 4. The cathode layer of the light-emitting element is coupled to a VSS signal line or a VSS signal terminal.

Each of the switching transistor and the driving transistor may be one of a bottom gate type silicon-based transistor, a top gate type silicon-based transistor and a dual gate type silicon-based transistor.

Taking a top gate type silicon-based transistor as an example, the base substrate 10 is a silicon substrate; each of the switching transistor and the driving transistor include an active layer 111 as a portion of the silicon substrate, a source electrode 115 and a drain electrode 116 at opposite sides of the active layer 111, a gate insulating layer 112, a gate electrode 113, and a first interlayer insulating layer 114. There are a plurality of second sub-portions 22 of the first electrode layer 2 provided at intervals, and the second sub-portions 22 are coupled to the source electrode 115, the gate electrode 113, and the drain electrode 116 through tungsten holes, respectively, so as to introduce signals to the source electrode 115 and the gate electrode 113 and extract signals output from the drain electrode 116. In addition, the second sub-portion 22 coupled to the drain electrode 116 is further coupled to the sub-portion of the second electrode layer 4 through a tungsten hole to provide a driving signal to the anode of the OLED light-emitting element.

The gate electrode 113 is made of a polysilicon material; the active layer 111 is formed by doping the silicon substrate; the source electrode 115 and the drain electrode 116 are formed by heavily doping the silicon substrate; and each of the gate insulating layer 112 and the first interlayer insulating layer 114 is made of silicon oxide, silicon oxynitride, or silicon nitride.

In some embodiments, the material of the base substrate 10 is not limited, and for example, the material of the base substrate 10 may be polyimide, glass, or the like. In addition, the switching transistor and the driving transistor may be thin film transistors.

Figure 3:
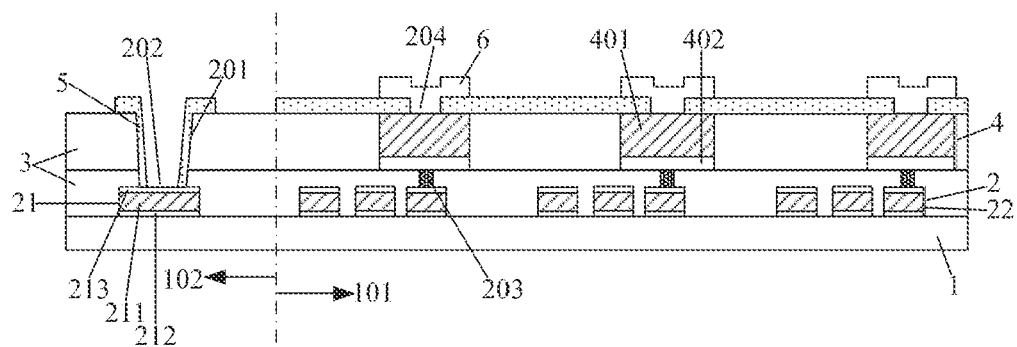
FIG. 3 is a structural cross-sectional view of another display substrate in an embodiment of the present disclosure.
Figure 4:
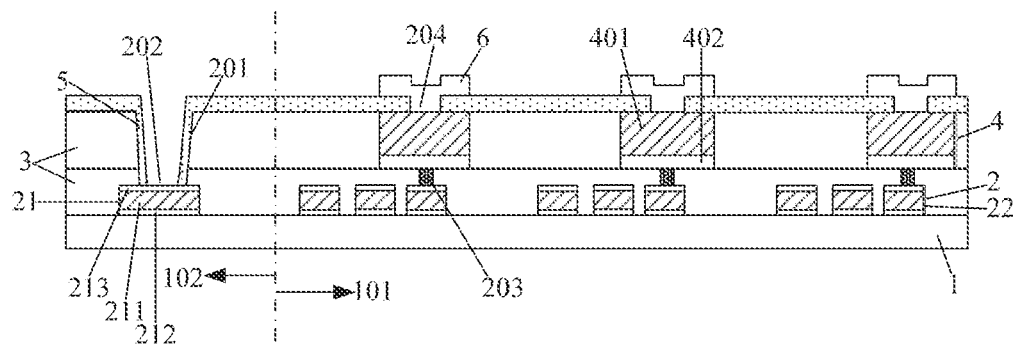
FIG. 4 is a structural cross-sectional view of still another display substrate in an embodiment of the present disclosure.

An embodiment of the present disclosure provides a display substrate, which is different from those in the above embodiments in that, the isolation layer 5 in the bonding region 102 further extends to cover a part of the insulating layer 3 surrounding the first via hole 201, as shown in FIG. 3.

In this embodiment, the arrangement of each structural film layer in the display substrate is the same as that in the above embodiment, and is not described herein again.

Figure 5:
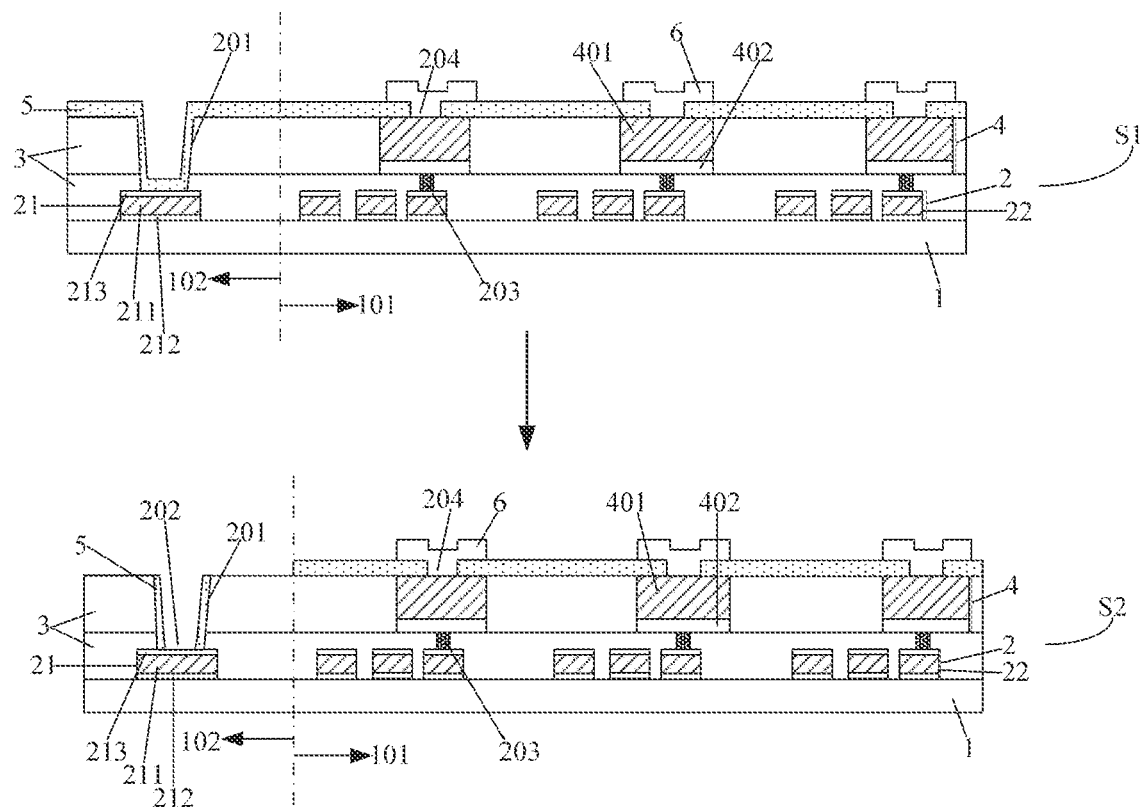
FIG. 5 is a schematic diagram illustrating processes for fabricating a display substrate in an embodiment of the present disclosure.

An embodiment of the present disclosure provides a display substrate, which is different from those in the above embodiments in that, the isolation layer 5 in the bonding region 102 further extends to cover the insulating layer 3 in addition to covering the first via hole 201, as shown in FIG. 5. In this embodiment, the arrangement of each structural film layer in the display substrate is the same as that in the above embodiment, and is not described herein again.

In the display substrate provided in the embodiments of the present disclosure, by providing the isolation layer between the second electrode layer and the transparent conductive layer and enabling the isolation layer to cover the whole bonding region before the transparent conductive layer is formed, the first sub-portion in the bonding region can be isolated from the transparent conductive layer, so that the first sub-portion is prevented from being corroded by etching when the pattern of the transparent conductive layer is formed by etching, and the problem that the first sub-portion is corroded when the pattern of the transparent conductive layer is formed by etching is further effectively solved. The portion of the isolation layer corresponding to the first via hole is removed after the transparent conductive layer is formed, namely, the second via hole is formed in the isolation layer, the first sub-portion is exposed at the first via hole and the second via hole whose axes coincide, so as to facilitate the bonding of first sub-portion and the peripheral circuit board. The fabricating process of the isolation layer is simple, which does not increase the complexity of the fabricating process of the display substrate.

An embodiment of the present disclosure further provides a method for fabricating the display substrate, as shown in FIG. 5, including steps S1 and S2.

In step S1, the driving circuit board 1 is fabricated; and the first electrode layer 2, the insulating layer 3 with the first via hole 201 and the third via hole 203 therein, the second electrode layer 4, the isolation layer 5 with the fourth via hole 204 therein, and the transparent conducting layer 6 are sequentially fabricated on the driving circuit board 1.

In step S2, the second via hole 202 is formed in the isolation layer 5.

The driving circuit board 1 includes the pixel region 101 and the bonding region 102.

The fabrication of the first electrode layer 2 includes fabricating the first sub-portion 21 in the bonding region 102 and the second sub-portion 22 in the pixel region 101. The first sub-portion 21 is configured to be bound to and coupled with the peripheral circuit board, and the second sub-portion 22 is coupled to the pixel circuit in the driving circuit board 1.

The fabrication of the insulating layer 3 includes forming the insulating layer 3 in both the bonding region 102 and the pixel region 101. The first via hole 201 is provided in an area of the insulating layer 3 corresponding to the first sub-portion 21 and the third via hole 203 is provided in an area of the insulating layer 3 corresponding to the second sub-portion 22.

The fabrication of the second electrode layer 4 includes forming the second electrode layer 4 in the pixel region 101, the second electrode layer 4 being coupled to the second sub-portion 22 through the third via hole 203.

The fabrication of the isolation layer 5 includes forming the isolation layer 5 in both the bonding region 102 and the pixel region 101. The fourth via hole 204 is provided in an area of the isolation layer 5 corresponding to the second electrode layer 4; the second via hole 202 is provided in an area of the isolation layer 5 corresponding to the first sub-portion 21; the axes of the first and second via holes 201 and 202 coincide, and the first sub-portion 21 is exposed at the first and second via holes 201 and 202.

The fabrication of the transparent conductive layer 6 includes forming the transparent conductive layer 6 in the pixel region 101. The transparent conductive layer 6 is coupled to the second electrode layer 4 through the fourth via hole 204.

In some embodiments, the first electrode layer 2, the second electrode layer 4, and the transparent conductive layer 6 are fabricated using a patterning process (including process steps of film forming, photoresist coating, exposure, development, etching, and the like). The insulating layer 3 and the first via hole 201 and the third via hole 203 therein are fabricated by a patterning process (including process steps of film forming, photoresist coating, exposure, development, etching, and the like). The isolation layer 5 and the second via hole 202 and the fourth via hole 204 therein are fabricated by a patterning process (including process steps of film forming, photoresist coating, exposure, development, etching, and the like).

In some embodiments, the active layer, the source electrode and the drain electrode of the silicon-based transistor in the driving circuit board 1 are fabricated by a doping process, and the gate electrode of the silicon-based transistor is converted from the gate electrode of the amorphous silicon material into the gate electrode of the polysilicon material by excimer laser annealing method. Other film layers of the silicon-based transistor and film layers of the storage capacitor in the driving circuit board 1 are fabricated by a conventional patterning process (including process steps of film forming, photoresist coating, exposure, development, etching and the like). Each film layer of the thin film transistor in the driving circuit board 1 is fabricated by using a conventional patterning process (including process steps of film forming, photoresist coating, exposure, development, etching, and the like), and is not described herein again.

In some embodiments, after the fabrication of the transparent conductive layer 6 is finished, the second via hole 202 in the isolation layer 5 is formed in the bonding region 102, while only the isolation layer 5 on the sidewall of the first via hole 201 in the bonding region 102 is remained, and the isolation layer 5 in other areas in the bonding region 102 is completely removed.

In some embodiments, after the fabrication of the transparent conductive layer 6 is finished, the second via hole 202 in the isolation layer 5 is formed in the bonding region 102, while the isolation layer 5 on the sidewall of the first via hole 201 and on a peripheral area around the first via hole 201 is remained in the bonding region 102, and the isolation layer 5 in other areas of the bonding region 102 is removed.

In some embodiments, after the fabrication of the transparent conductive layer 6 is finished, the second via hole 202 in the isolation layer 5 is formed in the bonding region 102, while the isolation layer 5 remains on the sidewall of the first via hole 201 as well as other areas in the bonding region 102.

In the method for fabricating the display substrate provided in the embodiments of the present disclosure, by fabricating the isolation layer after fabricating the second electrode layer and before fabricating the transparent conductive layer and enabling the isolation layer to cover both the pixel region and the bonding region, the first sub-portion in the bonding region can be isolated from the transparent conductive layer, so that the first sub-portion is prevented from being corroded by etching when the transparent conductive layer is formed by etching, and the problem that the first sub-portion is corroded when the transparent conductive layer is formed by etching is further effectively solved. The portion of the isolation layer corresponding to the first via hole is removed after the transparent conductive layer is formed, namely, the second via hole is formed in the isolation layer, the first sub-portion is exposed at the first via hole and the second via hole whose axes coincide, so as to facilitate the bonding of first sub-portion and the peripheral circuit board. The fabricating process of the isolation layer is simple, which does not increase the complexity of the fabricating process of the display substrate.

Figure 6:
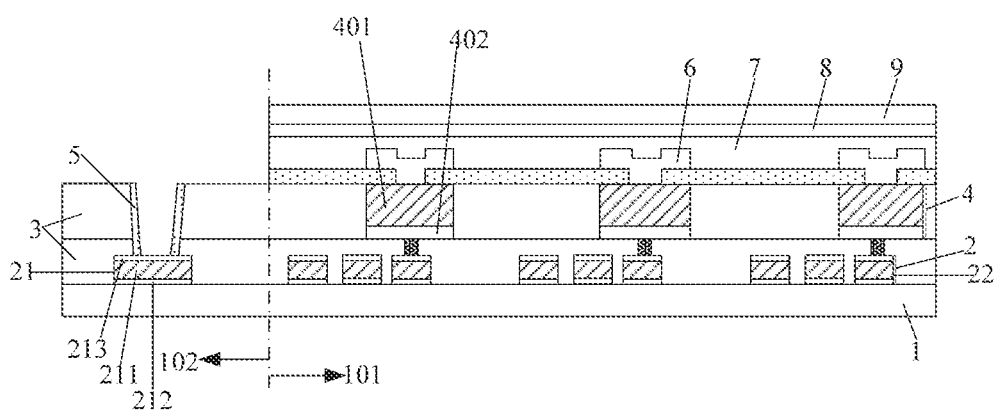
FIG. 6 is a structural cross-sectional view of a display panel in an embodiment of the present disclosure.

An embodiment of the present disclosure provides a display panel, as shown in FIG. 6, including the display substrate in any one of the above embodiments, and further including a light-emitting functional layer 7, a cathode 8, and an encapsulation layer 9, which are disposed in a pixel region of the display substrate, where the light-emitting functional layer 7, the cathode 8, and the encapsulation layer 9 are sequentially stacked on the transparent conductive layer 6.

The encapsulating layer 9 is configured to encapsulate the light-emitting element on the display substrate.

By adopting the display substrate in any one of the above embodiments, the first sub-portion, in the bonding region of the display substrate and configured for bonding with the peripheral circuit board, can be prevented from being corroded by etching when the anode pattern of the transparent conductive layer of the light-emitting element is formed by etching, so that the quality of the display panel is ensured.

The display panel provided by the embodiment of the present disclosure may be any product or component with a display function, such as an OLED panel, an OLED television, a display, a mobile phone, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A method for fabricating a display substrate, comprising:
    fabricating a driving circuit board;
    sequentially fabricating, on the driving circuit board, a first electrode layer, an insulating layer with a first via hole and a third via hole, a second electrode layer, an isolation layer with a fourth via hole, and a transparent conductive layer; and
    forming a second via hole in the isolation layer,
    wherein the driving circuit board comprises a pixel region and a bonding region;
    fabricating the first electrode layer comprises fabricating a first sub-portion in the bonding region and a second sub-portion in the pixel region, the first sub-portion being configured to be bound to and coupled with a peripheral circuit board, and the second sub-portion being coupled to a pixel circuit in the driving circuit board;
    fabricating the insulating layer comprises forming the insulating layer in both the bonding region and the pixel region, the first via hole being provided in an area of the insulating layer corresponding to the first sub-portion and the third via hole being provided in an area of the insulating layer corresponding to the second sub-portion;
    fabricating the second electrode layer comprises forming the second electrode layer in the pixel region, the second electrode layer being formed to be coupled to the second sub-portion through the third via hole;
    fabricating the isolation layer comprises forming the isolation layer in both the bonding region and the pixel region, the fourth via hole being provided in an area of the isolation layer corresponding to the second electrode layer, the second via hole being provided in an area of the isolation layer corresponding to the first sub-portion, wherein axes of the first and second via holes coincide, and the first sub-portion is exposed at the first and second via holes; and
    fabricating the transparent conductive layer comprises forming the transparent conductive layer in the pixel region, the transparent conductive layer being formed to be coupled to the second electrode layer through the fourth via hole,
    wherein the isolation layer is fabricated after the fabrication of the second electrode layer and before the fabrication of the transparent conductive layer, and the second via hole is formed after the fabrication of the transparent conductive layer.

2. The method of claim 1, wherein in the bonding region, the isolation layer is configured to cover a sidewall of the first via hole.

3. The method of claim 2, wherein in the bonding region, the isolation layer is configured to further extend to cover a part of the insulating layer surrounding the first via hole.

4. The method of claim 2, wherein in the bonding region, the isolation layer is configured to further extend to cover the insulating layer in addition to covering the first via hole.

5. The method of claim 1, wherein an orthographic projection of the transparent conductive layer on the driving circuit board coincides with an orthographic projection of the second electrode layer on the driving circuit board.

6. The method of claim 1, wherein an orthographic projection of the second electrode layer on the driving circuit board at least partially overlaps an orthographic projection of the second sub-portion on the driving circuit board.

7. The method of claim 1, wherein a surface of the second electrode layer away from the driving circuit board is flush with a surface of the insulating layer away from the driving circuit board.

8. The method of claim 1, wherein the first electrode layer comprises a first metal layer, and a material of the first metal layer comprises aluminum.

9. The method of claim 8, wherein the first electrode layer further comprises a first protective layer on a side of the first metal layer away from the insulating layer.

10. The method of claim 9, wherein the first electrode layer further comprises a second protective layer on a side of the first metal layer close to the insulating layer.

11. The method of claim 10, wherein the first protective layer comprises at least one of a first sub-protective layer and a second sub-protective layer; the second protective layer comprises at least one of a first sub-protective layer and a second sub-protective layer; the first sub-protective layer and the second sub-protective layer of the first protective layer are sequentially stacked in a direction away from the first metal layer, and the first sub-protective layer and the second sub-protective layer of the second protective layer are sequentially stacked in a direction away from the first metal layer; and a material of the first sub-protective layer of each of the first protective layer and the second protective layer comprises titanium, and a material of the second sub-protective layer of each of the first protective layer and the second protective layer comprises titanium nitride.

12. The method of claim 1, wherein the second electrode layer comprises a second metal layer, and a material of the second metal layer comprises aluminum.

13. The method of claim 12, wherein the second electrode layer further comprises a third protective layer on a side of the second metal layer close to the insulating layer.

14. The method of claim 13, wherein the third protective layer comprises at least one of a first sub-protective layer and a second sub-protective layer; the first sub-protective layer and the second sub-protective layer are sequentially stacked in a direction away from the second metal layer; and a material of the first sub-protective layer comprises titanium, and a material of the second sub-protective layer comprises titanium nitride.

15. The method of claim 1, wherein the isolation layer is made of an inorganic insulating material.

16. The method of claim 15, wherein the isolation layer has a thickness from 200 Å to 2000 Å.

17. The method of claim 1, wherein the transparent conductive layer is made of a semiconductor metal oxide material.

18. The method of claim 17, wherein the transparent conductive layer has a thickness from 200 Å to 2000 Å.

* * * * *